United States Patent
Shih

(10) Patent No.: US 6,878,577 B2
(45) Date of Patent: Apr. 12, 2005

(54) METHOD OF FORMING LDD OF SEMICONDUCTOR DEVICES

(75) Inventor: Ming-Sung Shih, Taichung (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 10/604,761

(22) Filed: Aug. 14, 2003

(65) Prior Publication Data

US 2004/0229416 A1 Nov. 18, 2004

(30) Foreign Application Priority Data

May 15, 2003 (TW) ........................................ 92113180 A

(51) Int. Cl.⁷ ................................................ H01L 21/00
(52) U.S. Cl. ........................ 438/163; 438/365; 438/491; 438/514; 438/552
(58) Field of Search ................................ 438/149, 151, 438/163, 164, 166, 180, 181, 197, 301, 364, 365, 369, 486, 488, 491, 514, 552, 708, 725, 736, 737

(56) References Cited

U.S. PATENT DOCUMENTS

| | | | | |
|---|---|---|---|---|
| 4,231,811 A | * | 11/1980 | Somekh et al. ............. | 438/301 |
| 4,818,715 A | * | 4/1989 | Chao ........................... | 438/303 |
| 6,259,120 B1 | * | 7/2001 | Zhang et al. ................. | 257/72 |
| 6,331,476 B1 | * | 12/2001 | Kawakita et al. ........... | 438/486 |
| 6,403,406 B2 | * | 6/2002 | Lee et al. .................... | 438/153 |
| 6,410,211 B1 | * | 6/2002 | Bae ............................. | 430/318 |
| 6,452,241 B1 | * | 9/2002 | Fukata et al. ............... | 257/435 |
| 6,624,443 B2 | * | 9/2003 | Tanabe et al. ............... | 257/59 |
| 6,624,473 B1 | * | 9/2003 | Takehashi et al. .......... | 257/344 |

\* cited by examiner

*Primary Examiner*—John F. Niebling
*Assistant Examiner*—Stanetta Isaac
(74) *Attorney, Agent, or Firm*—Jiang Chyun IP Office

(57) ABSTRACT

A method of forming an LDD of a semiconductor device. A substrate having a polysilicon layer thereon is provided, wherein the polysilicon layer comprises a first region and a second region. A patterned photoresist layer is formed on the polysilicon layer for exposing the first region and covering the second region. The photoresist layer covering the second region comprises a middle portion and an edge portion, wherein the middle portion is thicker than the edge portion. Then, an ion implantation process is performed using the photoresist layer as a mask for forming a source/drain in the first region of the polysilicon layer and an LDD in the second region underneath the edge portion of the photoresist layer.

20 Claims, 7 Drawing Sheets

METHOD OF FORMING LDD OF SEMICONDUCTOR DEVICES

CROSS REFERENCE TO RELATED APPLICATIONS

This application claims the priority benefit of Taiwan application Serial No. 92113180, filed on May 15, 2003.

BACKGROUND OF INVENTION

1. Field of the Invention

The present invention relates to a method of making a lightly doped drain (LDD) of a semiconductor device. More particularly, the present invention relates to a method of making an LDD of a low temperature polysilicon thin film transistor (TFT) and a method of making an LDD of a metal oxide semiconductor (MOS) transistor.

2. Description of the Related Art

Distinguishable from conventional amorphous silicon TFT, low temperature polysilicon TFT can have electron mobility of above 200 $cm^2$/V-sec. Consequently, TFT devices can be made in smaller size and with higher aperture ratio so as to enhance the lightness of display panels and decrease power consumption. In addition, part of driving circuits, due to the enhanced electron mobility, the TFT can be formed simultaneously on the glass substrate, so as to improve the property and reliability of the liquid crystal display (LCD) panel and to significantly lower the fabrication costs of the LCD panel. Therefore, the manufacture costs of low temperature polysilicon TFT panels are much lower than the amorphous silicon TFT panels. Moreover, low temperature polysilicon TFT panels, which are characteristically thin in thickness, light in weight and superior in resolution, are especially suitable for making light, portable and power-saving mobile terminal products.

Earlier processes of making low polysilicon TFT panels include using semiconductor apparatus via solid phase crystallization (SPC). Since such processes are performed at a high temperature up to 1000° C., quartz substrates with high melting points must be used. Due to higher costs of quartz substrates compared to glass substrates and size restrictions, panels with quartz substrates can be made in sizes of 2 to 3 inches, and thus only small panels were developed in the past. More recently, with the development of laser technologies, a method of laser crystallization or excimer laser annealing is utilized to transform an amorphous silicon layer to a polysilicon layer. In the process of laser scanning, amorphous silicon is recrystallized to form polysilicon at a temperature lower than 600° C. Thus, glass substrates can be used for making larger TFT LCD panels.

FIGS. 1A to 1D are cross-sectional views illustrating steps of a process of forming an LDD of a conventional low temperature polysilicon TFT.

Referring to FIG. 1A, a patterned polysilicon layer 102 is formed on a substrate 100. In the process of forming the polysilicon layer 102, an amorphous silicon layer (not shown), deposited on the substrate 100, is first transformed to a polysilicon thin film via laser annealing and then defined via a photolithography process and an etching process to form the polysilicon layer 102.

Referring to FIG. 1B, a patterned photoresist layer 104 is formed on the substrate 100, wherein the photoresist layer 104 exposes a area predefined for forming source/drain. Subsequently, an ion implantation process 106 is performed by using the photoresist layer 104 as a mask so as to implant ions into the polysilicon layer 102 not covered by the photoresist layer 104 to form a source 102a and a drain 102b.

Referring to FIG. 1C, after the photoresist layer 104 is removed, an insulating layer 108 is formed on the substrate 100 to cover the source/drain 102a/102b. A gate 110 is then formed on the insulating layer 108.

Referring to FIG. 1D, a patterned photoresist layer 112 is formed on the insulating layer 108, exposing the gate 110 and a region predefined to form an LDD. An ion implantation process 114 is then performed by using the photoresist layer 112 and the gate 110 as a mask to implant ions into the portion not covered by the photoresist layer 112 and the gate 110 to form an LDD 103. The portion located between the source/drain 102a/102b and the LDD 103 is a channel region 102c of the device.

Therefore, the conventional method of making an LDD of a low temperature polysilicon TFT requires two masking steps and two ion implantation steps, and the process is rather complicated. Especially, since it is not easy to control mask position in two masking steps and may get misaligned, accordingly, it is rather difficult to precisely control the width of the LDD. Any deviation in mask position between two mask steps will lead to discontinuity of the source/drain and the LDD at the interface between the source/drain and the LDD, which will adversely affect the electrical properties of the device.

SUMMARY OF INVENTION

Accordingly, in the light of the foregoing, one object of the present invention is to provide a method of forming an LDD of a semiconductor device with a view to simplify the complicated conventional method that requires two masking steps and two ion implantation steps for forming an LDD of low temperature polysilicon TFT.

Another object of the present invention is also to provide a method of forming an LDD of a semiconductor device to resolve the problems resulting from mask mis-alignment between the two masking steps.

Another object of the present invention is to provide a method of forming an LDD of a semiconductor device, in which both the source/drain and the LDD can be formed by performing a single masking step and a single ion implantation step.

In accordance with the above objects and other advantages, as embodied and broadly described herein, the present invention provides a method of forming an LDD of low temperature polysilicon TFT and a method of forming an LDD of MOS transistor. A substrate having a polysilicon layer thereon is provided. The polysilicon layer comprises a first region and a second region. Preferably, the method of forming the polysilicon layer include depositing an amorphous silicon layer on the substrate, transforming the amorphous silicon layer into a polysilicon layer via laser annealing, and further defining the polysilicon layer via photolithographic and etching processes. After forming the polysilicon layer, a photoresist layer is formed on the polysilicon layer. A mask having a non-exposing region, an exposing region and a partial-exposing region is set above the photoresist layer. In the present invention, the partial-exposing region of the mask comprises a pattern of a plurality of long strips. A photolithographic process is then performed to pattern the photoresist layer for exposing the first region and covering the second region of the polysilicon layer. The photoresist layer covering the second region comprises a middle portion and an edge portion, wherein the middle portion is thicker than the edge portion. The middle portion and the edge portion of the photoresist layer are formed in different thickness through the non-exposing region and the partial-exposing region. Then, an implantation process is performed by using the patterned photoresist layer as a mask for forming a source/drain in the first region of the polysilicon layer and, at the same time, forming an LDD in the polysilicon layer covered by the edge portion of the photoresist layer.

In the method of forming an LDD of a semiconductor device, a substrate having a first region and a second region thereon is provided. A photoresist layer is then formed on the substrate. A mask is set above the photoresist layer. The mask comprises a non-exposing region, an exposing region and a partial-exposing region. In the present invention, the partial-exposing region of the mask comprises a pattern of a plurality of long strips. A photolithographic process is then performed to pattern the photoresist layer for exposing the first region of the polysilicon layer and covering the second region of the polysilicon layer. The photoresist layer covering the second region comprises a middle portion and an edge portion, wherein the middle portion is thicker than the edge portion. The middle portion and the edge portion of the photoresist layer are formed in different thickness through the non-exposing region and the partial-exposing region of the mask, respectively. Then, an implantation process is performed by using the patterned photoresist layer as a mask for forming a source/drain in the first region of the substrate and, at the same time, forming an LDD in the substrate covered by the edge portion of the photoresist layer.

The method of the present invention is much simple comparing to the prior art since both the source/drain and the LDD of the device are formed in a single ion implantation step in the present invention.

According to one aspect of the present invention, the source/drain and the LDD of the device are simultaneously formed by performing a single masking step and a single ion implantation step, and therefore the problems resulting from mask mis-alignment between the two masking steps as described in the conventional method can be effectively avoided.

According to another aspect of the present invention, the pattern design of the partial-exposing region of the mask can be utilized to control the thickness of the patterned photoresist layer. Further, the post-exposure baking temperature can be utilized to control the density of the photoresist layer to further control the ion doping concentration in the LDD.

It is to be understood that both the foregoing general description and the following detailed description are exemplary, and are intended to provide further explanation of the invention as claimed.

BRIEF DESCRIPTION OF DRAWINGS

The accompanying drawings are comprised to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
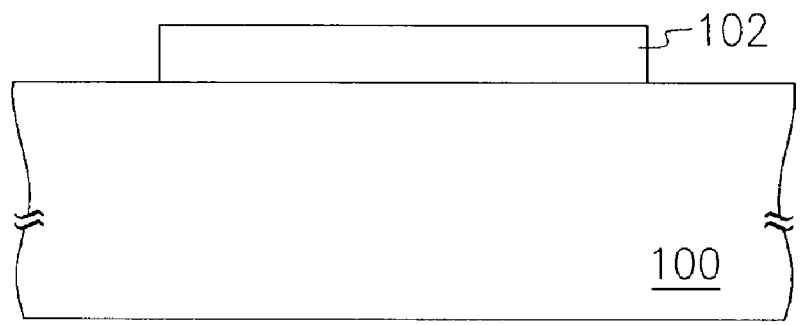
FIGS. 1A to 1D are cross-sectional views illustrating steps in the process of making an LDD of a low temperature polysilicon TFT according to prior art.
Figure 1B:
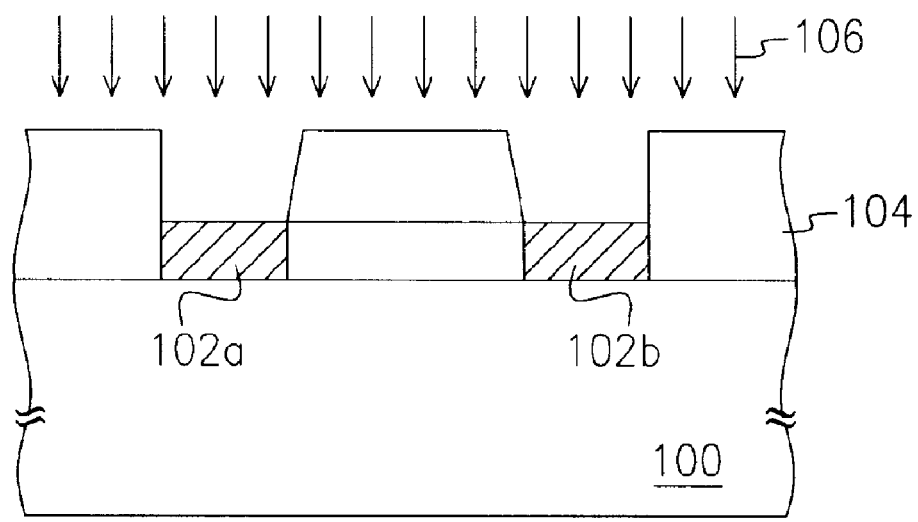
Figure 1C:
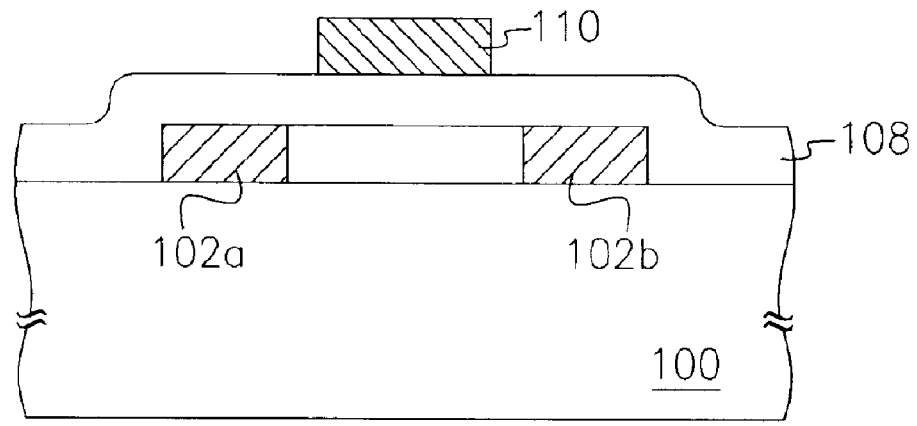
Figure 1D:
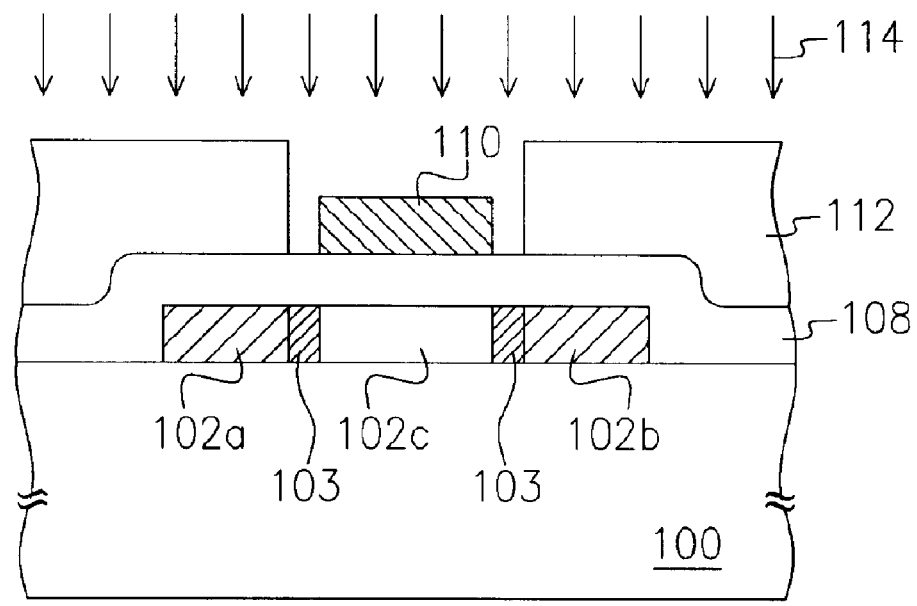
Figure 2A:
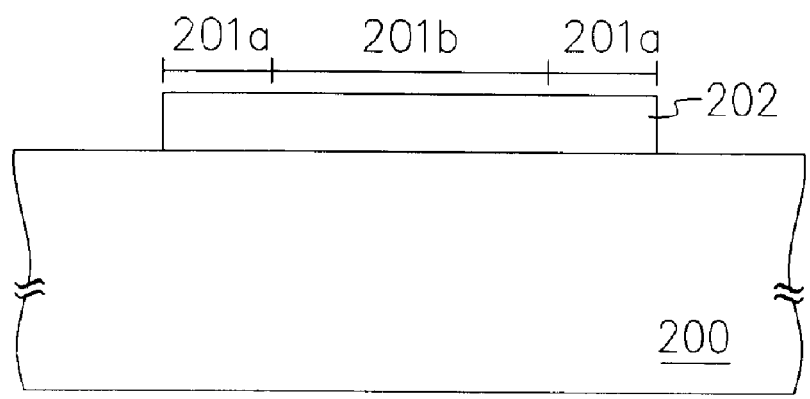
FIGS. 2A to 2D are cross-sectional views illustrating steps in a process of making an LDD of a low temperature polysilicon TFT according to a preferred embodiment of the invention.

Referring to FIG. 2A, a substrate 200 having a polysilicon layer 202 thereon is provided. The polysilicon layer 202 comprises a first region 201a and a second region 201b. In the preferred embodiment of the present invention, a method of forming the polysilicon layer 202 includes depositing an amorphous silicon layer (not shown) on the substrate 200, transforming the amorphous silicon layer into a polysilicon layer via laser annealing, and further defining the polysilicon layer 202 via photolithographic and etching processes.

Figure 2B:
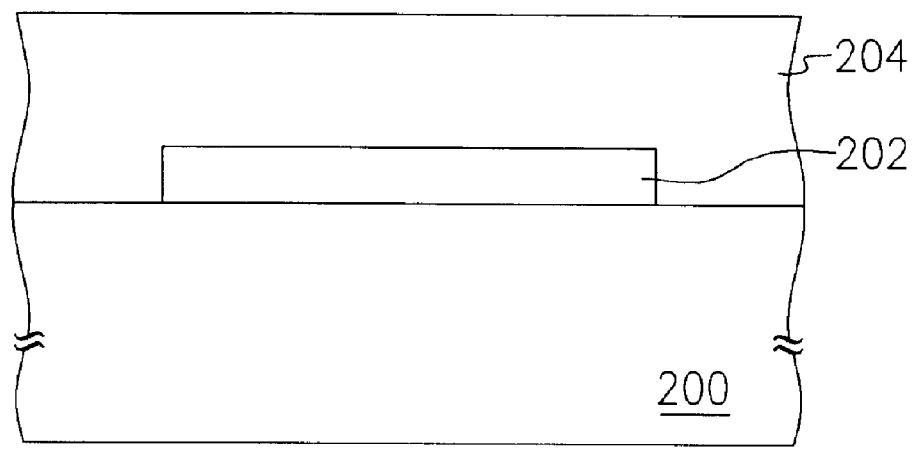
Figure 2C:
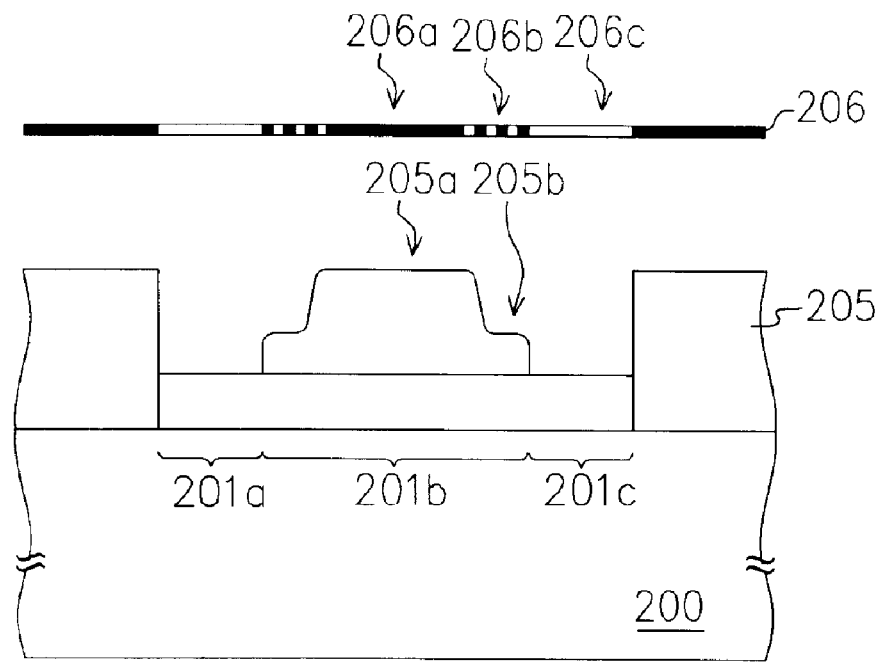

Referring to FIGS. 2B and 2C, after the polysilicon layer 202 is formed, a photoresist layer 204 is formed on the polysilicon layer 202. A mask 206 is set above the photoresist layer 204, wherein the mask 206 comprises a non-exposing region 206a, an exposing region 206c, and a partial-exposing region 206b.

Figure 3:
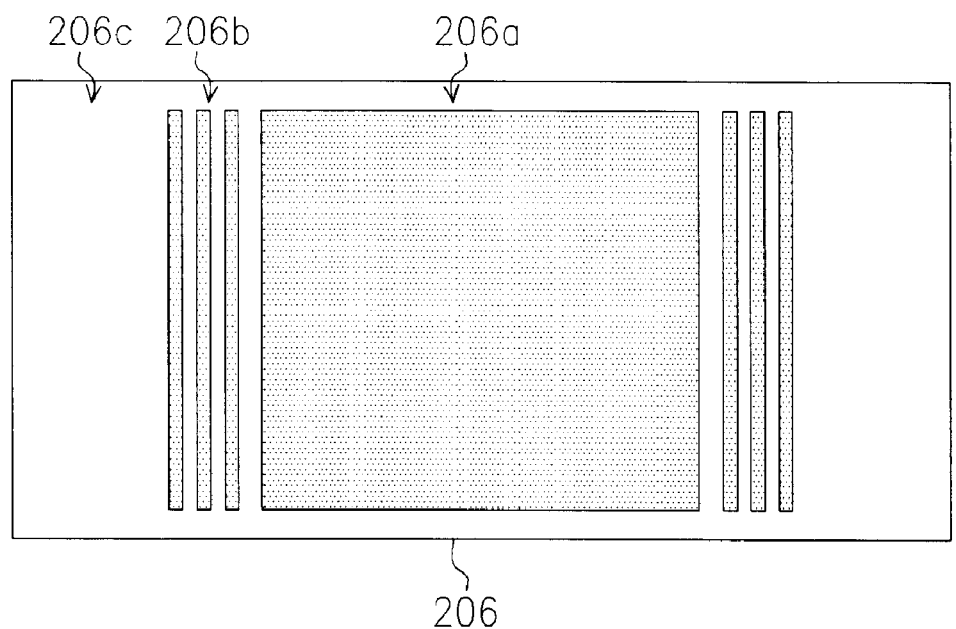
FIG. 3 shows a top view of the mask in FIG. 2C.

In the preferred embodiment of the present invention, as shown in FIG. 3, the partial-exposing region 206b of the mask 206 comprises a pattern of a plurality of long strips. The partial-exposing region 206b of the mask 206 corresponds to a region predefined for forming an LDD. In the partial-exposing region 206b, the width of the patterned long strips is, for example, 0.05 to 0.5 $\mu$m, and the distance between two adjacent patterned long strips is, for example, 0.05 to 0.5 $\mu$m. The non-exposing region 206a of the mask 206 corresponds to a region predefined for forming a channel region. The exposing region 206c corresponds to a region predefined for forming a source/drain.

Referring to FIG. 2C, photolithography and etching processes are performed to pattern the photoresist layer 204 to form a patterned photoresist layer 205 such that regions 201a and 201c of the polysilicon layer 202 are exposed and a region 201b of the polysilicon layer 202 remain covered by the patterned photoresist layer 205. The portion of the patterned photoresist layer 205 covering the second region 201b comprises a middle portion 205a and an edge portion 205b, wherein the middle portion 205a is thicker than the edge portion 205b. The middle portion 205a and the edge portion 205b of the photoresist layer 205 are formed in different thickness through the non-exposing region 206a and the partial-exposing region 206b of the mask 206. The thickness of the middle portion 205a of the photoresist layer 205 is, for example, 1 to 5 $\mu$m, whereas the thickness of the edge portion 205b of the photoresist layer 205 is, for example, 0.1 to 1 $\mu$m.

Figure 2D:
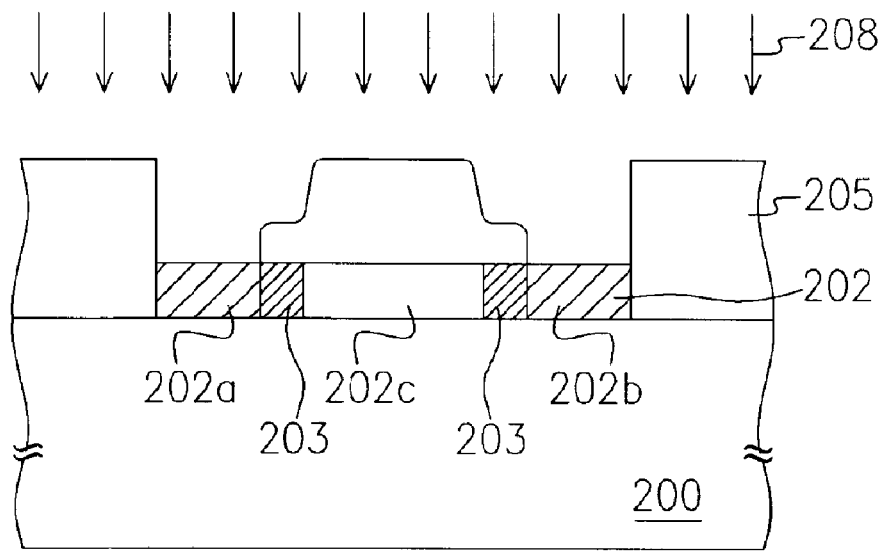

Referring to FIG. 2D, an implantation process 208 is performed using the photoresist layer 205 as a mask for forming a source 202a and a drain 202b in the regions 201a and 201c of the polysilicon layer 202 respectively, and at the same time, an LDD 203 is formed in the polysilicon layer 202 underneath the edge portion 205b of the photoresist layer 205. The portion of the polysilicon layer between the source/drain 202a/202b and the LDD 203 is a channel region 202c of the device. In the embodiment, the ion concentration in the source/drain 202a/202b is, for example, $1\times10^{14}$ to $1\times10^{15}$ ions/cm$^3$, the ion concentration in the LDD 203 is, for example, $1\times10^{12}$ to $1\times10^{14}$ ions/cm$^3$, and the width of the LDD 203 is, for example, 0.1 to 1 $\mu$m.

Subsequently, the photoresist layer 205 is removed, a gate structure including a gate insulating layer, a gate and source/drain metal lines, is formed over the channel region 203c for forming a low temperature polysilicon TFT.

In the method of the present invention of forming an LDD, a mask having a partial-exposing region is utilized to form a patterned photoresist layer with various thickness, can be used to form a semiconductor device in a logical circuit, a detailed description of which is presented as followings.

Referring to FIGS. 4A to 4D, a substrate 300 having a first region 301a and a second region 301b thereon is provided. A photoresist layer 302 is then formed on the substrate 300. A mask 306 is set above the photoresist layer 302. The mask 306 comprises a non-exposing region 306a, an exposing region 306c, and a partial-exposing region 306b. In the embodiment, the partial-exposing region 306b of the mask 306 comprises a pattern of a plurality of long strips. The width of each patterned long strip is, for example, 0.005 to 0.05 μm, and the distance between two adjacent patterned long strips is, for example, 0.005 to 0.05 μm.

Further, photolithography and etching processes are performed to pattern the photoresist layer 302 to form a patterned photoresist layer 305 such that a first region 301a of the substrate 300 is exposed, and a second region 301b of the substrate 300 remain covered by the patterned photoresist layer 305. The patterned photoresist layer 305 covering the second region 301b comprises a middle portion 305a and an edge portion 305b, wherein the middle portion 305a is thicker than the edge portion 305b. In the preferred embodiment of the present invention, the thickness of the middle portion 305a of the photoresist layer 305 is, for example, 0.1 to 1 μm, and the thickness of the edge portion 305b of the photoresist layer 305 is, for example, 0.01 to 0.1 μm. It should be noted that the middle portion 305a and an edge portion 305b of the photoresist layer 305 are formed in different thickness through the non-exposing region 306a and the partial-exposing region 306b of the mask 206.

Figure 4A:
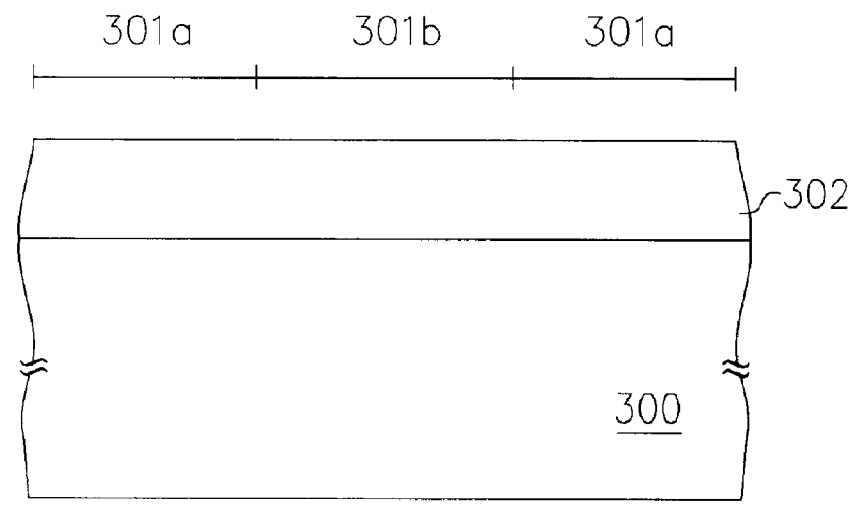
FIGS. 4A to 4D are cross-sectional views illustrating steps in a process of making a semiconductor device according to a preferred embodiment of the invention.
Figure 4B:
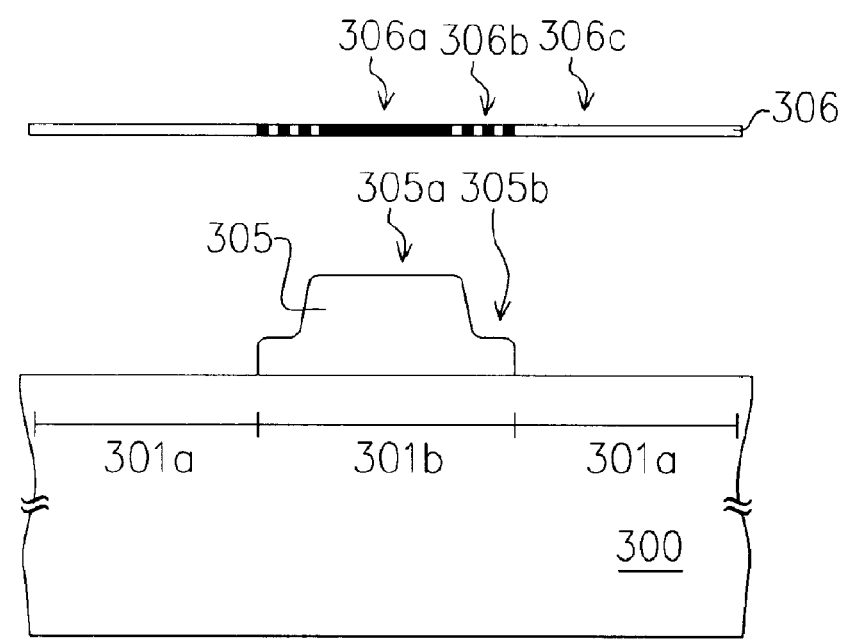
Figure 4C:
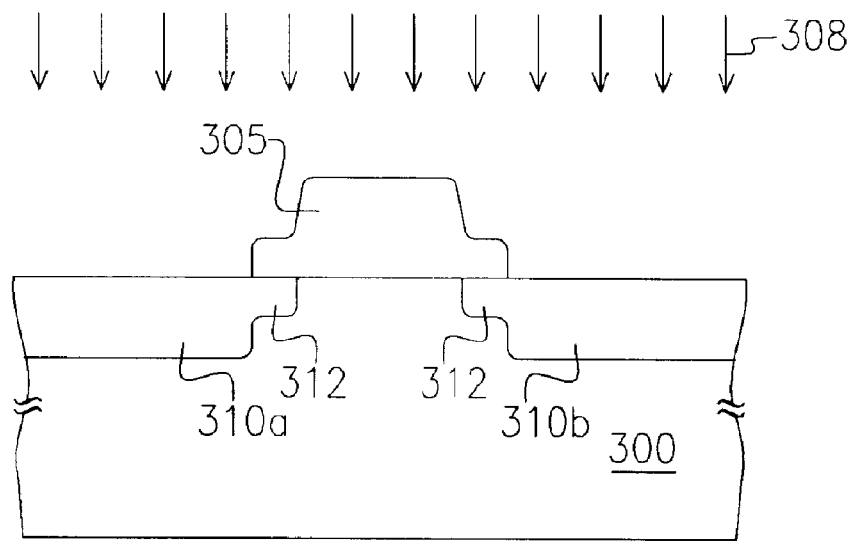

Referring to FIG. 4C, an implantation process 308 is performed using the photoresist layer 305 as a mask for forming a source 310a and a drain 310b in the first region 301a of the substrate 300, and at the same time, an LDD 312 is formed in the substrate 300 underneath the edge portion 305b of the patterned photoresist layer 305. In the preferred embodiment of the present invention, the ion concentration in the source/drain 302a/302b is, for example, $1 \times 10^{13}$ to $1 \times 10^{16}$ ions/cm$^3$, the ion concentration in the LDD 312 is, for example. $1 \times 10^{12}$ to $1 \times 10^{15}$ ions/cm$^3$, and the LDD 312 is formed in a width of, for example, 0.01 to 0.1 μm.

Figure 4D:
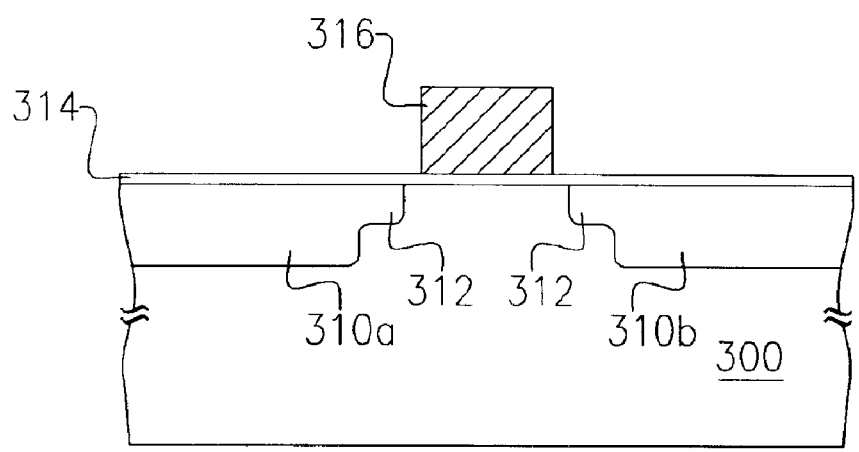

Referring to FIG. 4D, after the photoresist layer 305 is removed, a gate insulating layer 314 is formed on the substrate 300, and then a gate 316 is formed on the gate insulating layer 314 for forming an MOS semiconductor device.

In the method of forming an LDD of low temperature polysilicon TFT of the present invention, both the source/drain and the LDD of the device are formed by performing a single masking step and a single ion implantation step. Consequently, not only the process can be simplified but the difficulties of controlling mask position in order avoid mis-alignment between two masking steps of the prior art can also be effectively avoided. In addition, because both the source/drain and the LDD of the MOS device are formed by a single ion implantation step, and therefore the source/drain and the LDD are in continuity with each other, and thus the reliability of the device can be effectively promoted. Specifically, the method of the present invention utilizes the pattern of the partial-exposing region of the mask to control the thickness of the patterned photoresist layer and further to control the ion doping concentration in the LDD. Moreover, the post-exposure baking temperature is utilized to control the density of the photoresist layer and also further to control the ion doping concentration in the LDD.

In view of the foregoing, the method of the present invention has the following advantages, for example: 1. The method of the present invention is much simple comparing to the prior art since both the source/drain and the LDD of the device are simultaneously formed in a single ion implantation step. 2. Because the source/drain and the LDD of the device are simultaneously formed in a single masking step and a single ion implantation step, and therefore the difficulties of controlling mask position in order to avoid misalignment of masks between two masking steps of the prior art can be effectively eliminated. 3. The partial-exposing region of the mask can be used to form a patterned photoresist layer having differential thickness so that the source/drain and the LDD can be formed in a single ion implantation step. Further, the thickness of the patterned photoresist layer can be controlled to control the doping concentration of the LDD. Furthermore, the post-exposure baking temperature may be varied to control the density of the patterned photoresist layer to further control the ion doping concentration of the LDD.

It will be apparent to those skilled in the art that various modifications and variations can be made to the features of the present invention without departing from the scope and spirit of the present invention. In view of the foregoing, it is intended that the present invention covers modifications and variations of this invention provided they fall within the scope of the following claims and their equivalents.

What is claimed is:

1. A method of forming an LDD of a low temperature polysilicon TFT, comprising:

providing a substrate having a polysilicon layer thereon, wherein the polysilicon layer comprises a first region and a second region;

forming a patterned photoresist layer on the polysilicon layer for exposing the first region and covering the second region, wherein the patterned photoresist layer covering the second region comprises a middle portion and an edge portion, and wherein the middle portion is thicker than the edge portion; and performing an ion implantation step using the photoresist layer as a mask for simultaneously forming a source/drain in the first region of the polysilicon layer and an LDD in the polysilicon layer underneath the edge portion of the patterned photoresist layer.

2. The method of claim 1, wherein the thickness of the middle portion of the photoresist layer is about 1 to 5 μm and the thickness of the edge portion of the photoresist layer is about 0.1 to 1 μm.

3. The method of claim 1, wherein the width of the LDD is about 0.1 to 1 μm.

4. The method of claim 1, wherein the step of forming the polysilicon layer comprises:

forming an amorphous silicon layer on the substrate;

performing a laser annealing process for transforming the amorphous silicon layer to a polysilicon layer; and performing a photolithography and etching process for defining the polysilicon layer.

5. The method of claim 1, wherein the ion concentration in the source/drain is about $1 \times 10^{14}$ to $1 \times 10^{15}$ ions/cm$^3$, and the ion concentration in the LDD is about $1 \times 10^{12}$ to $1 \times 10^{14}$ ions/cm$^3$.

6. A method of forming an LDD of a low temperature polysilicon TFT, comprising:

providing a substrate having a polysilicon layer thereon, wherein the polysilicon layer comprises a first region and a second region;

forming a photoresist layer on the polysilicon layer;

setting a mask above the photoresist layer, wherein the mask comprises a non-exposing region, a exposing region, and a partial-exposing region;

performing a photolithography and etching process for forming a patterned photoresist layer, wherein the first region of the polysilicon layer is exposed and the second region of the polysilicon layer remain covered by the patterned photoresist, wherein the portion of the patterned photoresist layer covering the second region comprises a middle portion and an edge portion, wherein the middle portion is thicker than the edge portion, and wherein the middle portion and the edge portion of the photoresist layer are formed in different thickness through the non-exposing region and the partial-exposing region, respectively; and performing an ion implantation process by using the patterned photoresist layer as a mask for simultaneously forming a source/drain in the first region of the polysilicon layer and an LDD in the polysilicon layer underneath the edge portion of the patterned photoresist layer.

7. The method of claim 6, wherein the partial-exposing region of the mask comprises a pattern of a plurality of long strips.

8. The method of claim 7, wherein the width of the long strips is about 0.05 to 0.5 $\mu$m, and the distance between two adjacent long strips is about 0.05 to 0.5 $\mu$m.

9. The method of claim 6, wherein the thickness of the middle portion of the photoresist layer is about 1 to 5 $\mu$m, and the thickness of the edge portion of the photoresist layer is about 0.1 to 1 $\mu$m.

10. The method of claim 6, wherein the width of the LDD is about 0.1 to 1 $\mu$m.

11. The method of claim 6, wherein the step of forming the polysilicon layer comprises:
   forming an amorphous silicon layer on the substrate;
   performing a laser annealing process for transforming the amorphous silicon layer to a polysilicon layer; and
   performing a photolithography and etching process for defining the polysilicon layer.

12. The method of claim 6, wherein the ion concentration in the source/drain is about $1\times10^{14}$ to $1\times10^{15}$ ions/cm$^3$, and the ion concentration in the LDD is about $1\times10^{12}$ to $1\times10^{14}$ ions/cm$^3$.

13. A method of forming an LDD of a semiconductor device, comprising:
   providing a substrate comprising a first region and a second region;
   forming a photoresist layer on the substrate;
   setting a mask above the substrate, wherein the mask comprises a non-exposing region, an exposing region, and a partial-exposing region;
   performing a photolithography and etching process for forming a patterned photoresist layer, wherein the first region of the substrate is exposed and the second region of the substrate remain covered by a portion of the patterned photoresist layer, wherein the portion of the patterned photoresist layer covering the second region comprises a middle portion and an edge portion, wherein the middle portion is thicker than the edge portion, and wherein the middle portion and the edge portion of the photoresist layer are formed in different thickness through the non-exposing region and the partial-exposing region; and
   performing an ion implantation process using the photoresist layer as a mask for simultaneously forming a source/drain in the first region of the substrate and an LDD in the substrate underneath the edge portion of the photoresist layer.

14. The method of claim 13, wherein the partial-exposing region of the mask comprises a pattern of a plurality of long strips.

15. The method of claim 14, wherein the width of the long strips is about 0.005 to 0.05 $\mu$m, and the distance between two adjacent long strips is about 0.005 to 0.05 $\mu$m.

16. The method of claim 13, wherein the thickness of the middle portion of the photoresist layer is about 1 to 5 $\mu$m, and the thickness of the edge portion of the photoresist layer is about 0.1 to 1 $\mu$m.

17. The method of claim 13, wherein the width of the LDD is about 0.1 to 1 $\mu$m.

18. The method of claim 13, wherein the ion concentration in the source/drain is about $1\times10^{13}$ to $1\times10^{16}$ ions/cm$^3$, and the ion concentration in the LDD is about $1\times10^{12}$ to $1\times10^{15}$ ions/cm$^3$.

19. A method of forming a low temperature polysilicon TFT, comprising:
   providing a substrate having a polysilicon layer thereon, wherein the polysilicon layer comprises a first region and a second region;
   providing a mask comprising a non-exposing region, an exposing region and a partial-exposing region;
   forming a patterned photoresist layer on the polysilicon layer for exposing the first region and covering the second region, wherein the patterned photoresist layer covering the second region comprises a middle portion and an edge portion, and wherein the middle portion is thicker than the edge portion;
   performing an ion implantation step using the photoresist layer as a mask for simultaneously forming a source/drain in the first region of the polysilicon layer and an LDD in the polysilicon layer underneath the edge portion of the patterned photoresist layer;
   removing the patterned photoresist layer;
   forming a gate oxide layer over the source/drain and the LDD after forming the source/drain and the LDD; and
   forming a gate over the gate oxide layer.

20. A method of forming a low temperature polysilicon TFT, comprising:
   providing a substrate having a polysilicon layer thereon, wherein the polysilicon layer comprises a first region and a second region;
   forming a photoresist layer on the polysilicon layer;
   setting a mask above the photoresist layer, wherein the mask comprises a non-exposing region, a exposing region, and a partial-exposing region;
   performing a photolithography and etching process for forming a patterned photoresist layer, wherein the first region of the polysilicon layer is exposed and the second region of the polysilicon layer is covered by the patterned photoresist, wherein a portion of the patterned photoresist layer covering the second region of the polysilicon layer comprises a middle portion and an edge portion, wherein the middle portion is thicker than the edge portion, and wherein the middle portion and the edge portion of the photoresist layer are formed in different thickness through the non-exposing region and the partial-exposing region, respectively;
   performing an ion implantation process by using the patterned photoresist layer as a mask for simultaneously forming a source/drain in the first region of the polysilicon layer and an LDD in the polysilicon layer underneath the edge portion of the patterned photoresist layer;
   removing the patterned photoresist layer;
   forming a gate oxide layer over the source/drain and the LDD after forming the source/drain and LDD; and
   forming a gate over the gate oxide layer.

* * * * *